(12) United States Patent
Sassa et al.

(10) Patent No.: US 6,345,333 B1
(45) Date of Patent: *Feb. 5, 2002

(54) METHOD AND APPARATUS FOR REVERSE REWRITING

(75) Inventors: Akira Sassa, Saitama; Yuichi Suzuki, Chiba, both of (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/105,810

(22) Filed: Jun. 26, 1998

(30) Foreign Application Priority Data

Jul. 7, 1997 (JP) .......................................... 09-181540

(51) Int. Cl.[7] .............................................. G06F 12/00
(52) U.S. Cl. ...................................... 711/103; 711/154
(58) Field of Search .............................. 711/103, 154, 711/165; 365/185.3, 185.11, 185.29, 185.33

(56) References Cited

U.S. PATENT DOCUMENTS

| 3,681,764 A | * | 8/1972 | Conant, Jr. ................. 365/202 |
| 4,106,105 A | * | 8/1978 | Pross, Jr. .................... 711/107 |
| 4,763,305 A | | 8/1988 | Kuo ............................ 365/200 |
| 4,943,962 A | * | 7/1990 | Imamiya et al. ........ 365/230.08 |
| 5,363,330 A | * | 11/1994 | Kobayashi et al. ......... 365/185 |
| 5,396,468 A | | 3/1995 | Harari et al. ................ 365/218 |
| 5,426,609 A | * | 6/1995 | Okuda ......................... 365/201 |
| 5,430,674 A | * | 7/1995 | Javanifard ............... 365/185.1 |
| 5,650,962 A | | 7/1997 | Arase ..................... 365/185.18 |

FOREIGN PATENT DOCUMENTS

EP 0 444 774 9/1991

\* cited by examiner

Primary Examiner—Matthew Kim
Assistant Examiner—Christian P. Chace
(74) Attorney, Agent, or Firm—Frommer Lawrence & Haug LLP; William S. Frommer; Darren M. Simon

(57) ABSTRACT

The present invention prevents a damage concentration caused by a data erase/write-in to a particular cell, so as to increase a service life of a flash memory.

A CPU 17 determines whether a data which has been read out is a new one or a data having a reverse flag set (steps S1 and S2. If the reverse flag is not set, a reverse flag is set (step S3), so as to reverse the bit of the data when writing the data into a flash memory (steps S4 and S6). If a reverse flag is set, the reverse flag is reset (step S5) and the data is written into the flash memory (step S6).

6 Claims, 5 Drawing Sheets

METHOD AND APPARATUS FOR REVERSE REWRITING

BACKGROUND OF THE INVENTION

1. Field of the Invention

The present invention relates to a storage apparatus, data write-in method, data read-out method, and recording medium which can be preferably used for a NAND type flash memory.

2. Description of the Prior Art

Conventionally, it has been suggested to use flash memory as a storage apparatus for storing data for computer applications, still cameras, video cameras, and audio data (i.e., music).

This flash memory stores data by an electric charge accumulated in a cell and erases data on a block basis which is an erase unit.

In the flash memory, prior to carrying out a data write-in, the cell should be in a clear state, i.e., data should have been erased by removing electrons from the cell. Then, data is written into the flash memory when an electric charge is poured into the cell so as to reverse the cell state.

As has been described above, the flash memory erases data by removing electric charge from the cell on block basis. A large power load is applied to the memory in removing the stored charge from the cells. Moreover, when writing data, a large load is also applied to the cell into which electric charge is poured.

Consequently, when a data re-write is repeated without carrying out bit reversal or when data remains almost unchanged, there exist cells to which electric charge is poured over time and cells to which no electric charge is poured. Thus, there arises a deviation in cell damage within a block, which in turn may shorten the block's service life. Especially in the case of a management file or directory file where partial modifications are often carried out, repetition of a data write-in causes a cell damage deviation within the block.

By contrast, consider a flash memory where data re-write is carried out in a different block. However, there arises a problem that a management configuration is required for using a different block each time data is written, which results in a complicated configuration of the flash memory.

SUMMARY OF THE INVENTION

It is therefore an object of the present invention to provide a storage apparatus, a data write-in method, a data read-out method, and a recording medium which prevent concentration of damage to a particular cell caused by a data erase/write-in, thereby prolonging the serviceable life of the memory.

In order to achieve the aforementioned object, the storage apparatus according to the present invention includes: storage means for storing a data divided into blocks and a reverse flag indicating whether a bit of the data is reversed for each of the blocks; and control means for controlling a data write into the storage means and setting of a reverse flag.

In the aforementioned storage apparatus, the control means operates as follows. That is, if a reverse flag of a block to which a data from the storage means is to be written indicates a reversed bit, a reverse flag indicating no reversed bit is set when data is written, and if a reverse flag of a block to which a data from the storage means is to be written indicates no bit reversed, a reverse flag indicating a bit reverse to be executed is set and a data with bit reversed is written.

The data write-in method according to the present invention includes: a step of storing a data divided into a plurality of blocks and a reverse flag indicating whether a bit of the data is reversed for each of the blocks, so as to control a data write-in and a reverse flag setting.

According to this data write-in method, if a reverse flag of a block to which a data is to be written indicates a bit reversed, a reverse flag indicating no bit reversed is set when a data is written, and if a reverse flag of a block to which a data is to be written indicates no bit reversed, a reverse flag indicating a bit reverse to be executed is set and a data with bit reversed is written.

The storage apparatus according to the present invention includes: storage means for storing a data divided into a plurality of blocks and a reverse flag indicating whether a bit of the data is reversed in each of the blocks; and control means for controlling a read-out of a data from the storage means.

In the aforementioned storage apparatus, if a reverse flag of a block to which a data which has been read out from the control means belongs indicates that the bit is reversed, the control means controls reversal of the bits which have been read out.

The data read-out method according to the present invention includes: a step of storing data divided into blocks and a reverse flag indicating whether a bit of the data is reversed in each of the blocks when reading out stored data.

According to the aforementioned read-out method, a bit of data which has been read out is reversed if a reverse flag of a block to which the read out data belongs indicates that the bit is reversed.

The recording medium according to the present invention stores data divided into blocks and has a reverse flag indicating whether the bit of the data is reversed for each of the blocks.

According to the aforementioned recording medium, the reverse flag indicates whether a bit of the data recorded in each of the blocks is reversed.

DETAILED DESCRIPTION OF PREFERRED EMBODIMENTS

Hereinafter, description will be directed to preferred embodiments of the present invention with reference to the attached drawings.

Figure 1:
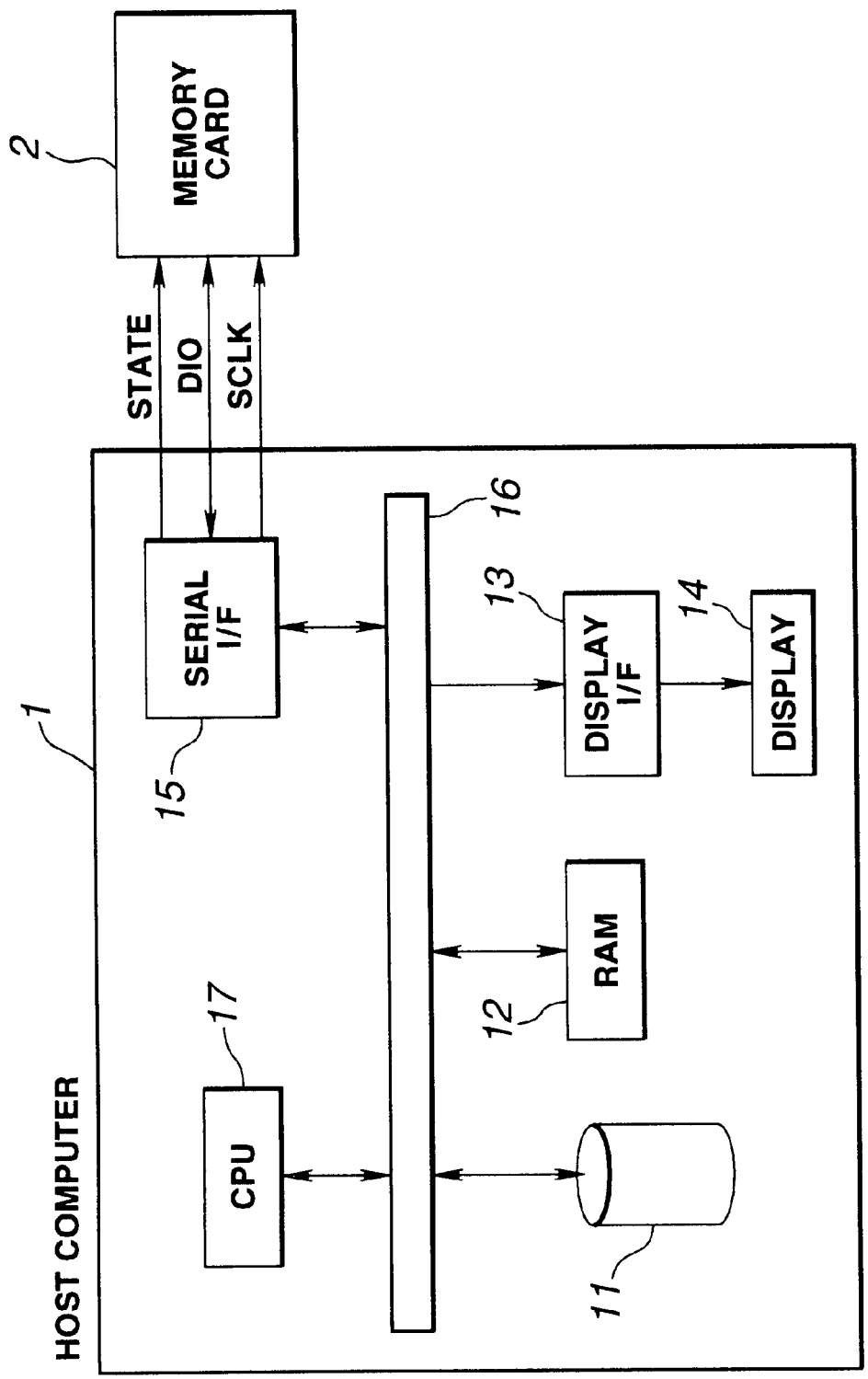
FIG. 1 is a block diagram showing a configuration of a memory (storage) apparatus according to the present invention.

As shown in FIG. 1, the present invention can be applied to a memory apparatus including a host computer 1 and a memory card 2.

The host computer 1 writes data into the memory card 2 and reads out data stored in the memory card 2.

More specifically, the host computer 1, as shown in FIG. 1, includes: a hard disc 11 for storing various data such as a still image and audio data; a RAM (random access memory) 12 for temporarily storing and reading out data from the hard disc 1; a display interface (hereinafter, referred to as a display I/F) 13; a display 14 for displaying an image according to data supplied via the display I/F 13; a serial interface (hereinafter, referred to as a serial I/F) 15 for carrying out data transmission and reception to/from the memory card 2 via three data lines; a bus 16; and a CPU (central processing unit) 17 for controlling the entire system.

The RAM 12, for example, temporarily stores data from the hard disc 11 via the bus 16 and when required, supplies the data via the bus 16 to the serial I/F 15.

The display 14 is supplied, via the bus 16 and the display I/F 13, with the data read out from the hard disc 11 as well as data from the memory card 2, so as to display a still image and a moving picture according to this data.

The serial I/F 15, via the three data lines, transmits data to the memory card 2 and receives data from the memory card 2. More specifically, via a first data line, the serial I/F 15 transmits data to be written into the memory card 2 and control data and receives data which has been read out from the memory card 2. Via a second data line, the serial I/F 15 outputs a status signal indicating a switching state according to a serial data DIO switch consisting of data or control data in the first data line. Furthermore, via a third data line, the serial I/F 15 transmits a serial clock SCLK when transmitting the aforementioned control data and data.

The CPU 17 controls data read out from the RAM 12 and the hard disc 11 and data written into the RAM 12 as well as controls data transmission and reception to/from the memory card 2. For example, the CPU 17 issues a register instruction used to determine whether an erroneous erase preventing switch of the memory card (which will be detailed later) is set to a write protect mode and issues a predetermined data write instruction with an address specification to the memory card 2.

Figure 2:
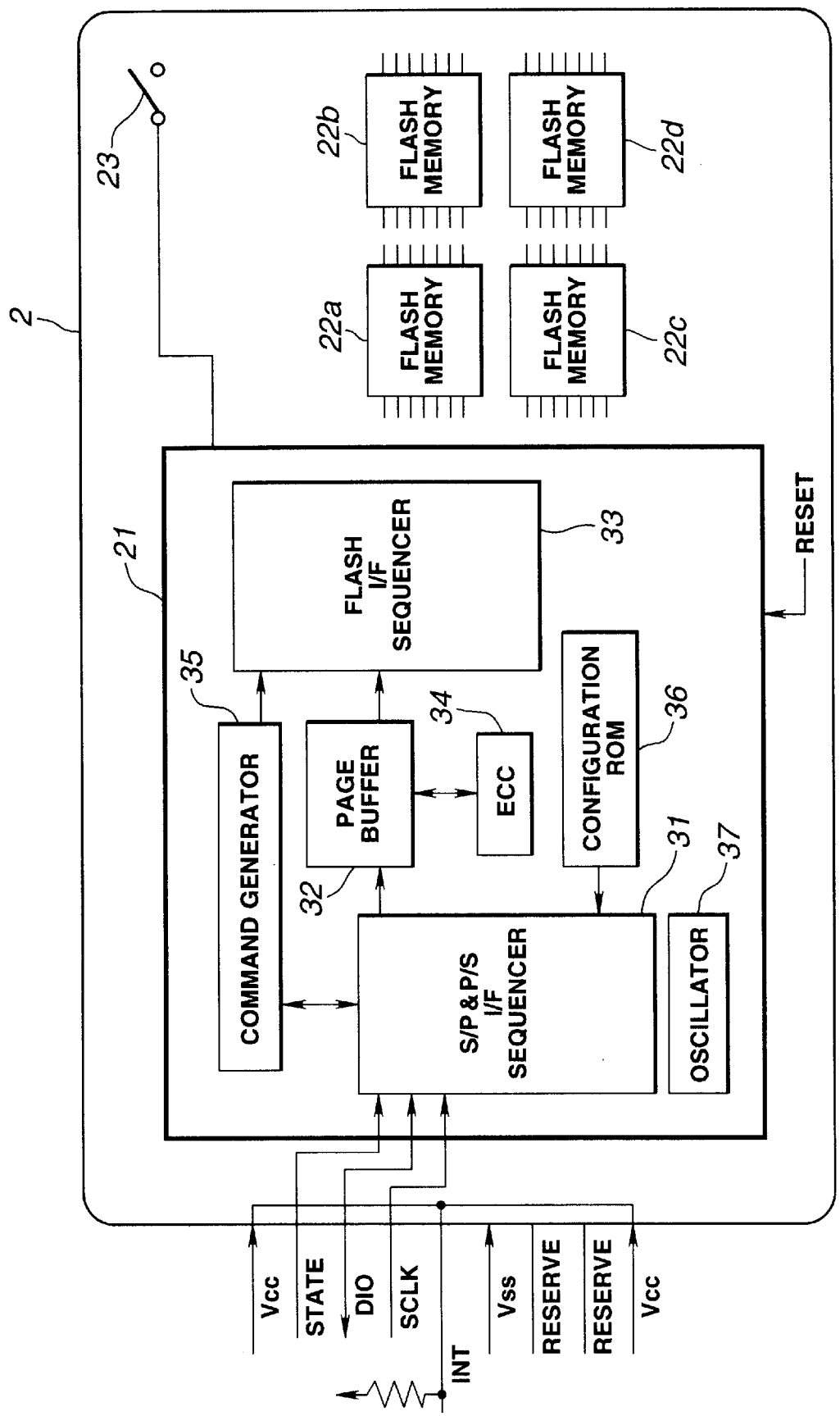
FIG. 2 is a block diagram showing a specific configuration of a memory card of the memory apparatus.

On the other hand, as shown in FIG. 2, the memory card 2 is connected to the aforementioned host computer 1 via two positive electrode DC power source line Vcc, a grounding line INT, a negative electrode DC power source Vss, and two reserved lines besides the aforementioned three data lines. Consequently, the memory card 2 is supplied via these DC power lines with power from the host computer 1 so as to drive respective circuits inside the memory card 2.

Here, the memory card 2, as shown in FIG. 2, includes a control IC 21 for receiving data and control data from the aforementioned host computer 1; a flash memory 22 for storing a data; and an erroneous erase preventing switch 23 for preventing erroneous erasure of data stored in the flash memory 22.

The control IC 21 determines whether the erroneous erase preventing switch 23 is set to the write protect ON or OFF state before writing data transmitted from the host computer 1, into the flash memory 22. Only if the write protect is in the OFF state, is the data written into the flash memory.

Figure 3:
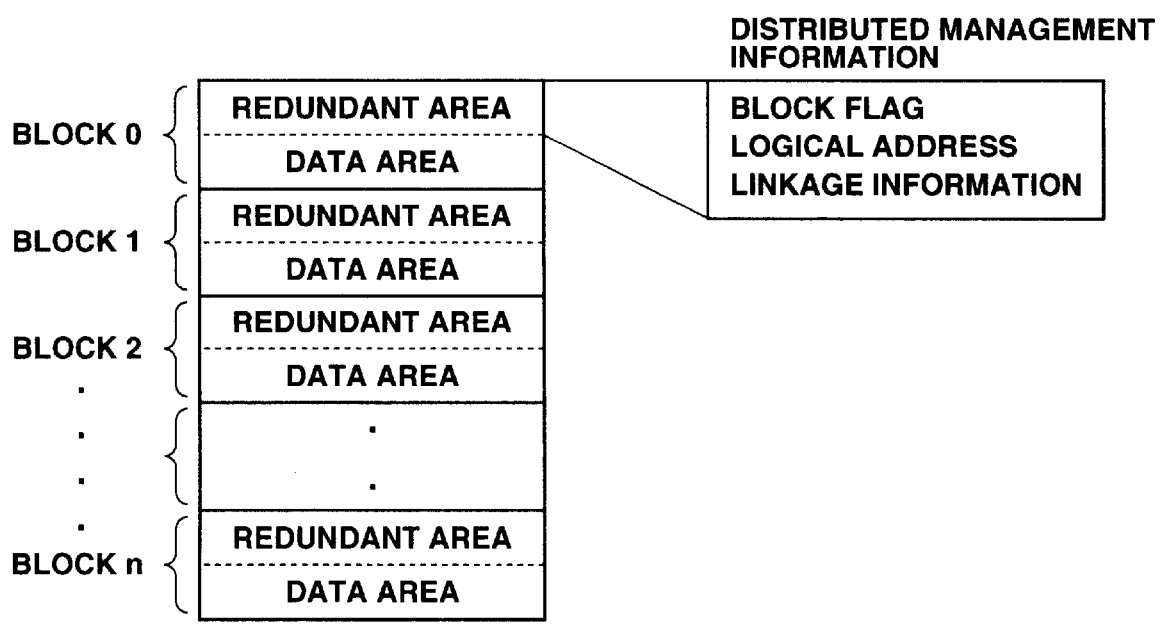
FIG. 3 schematically shows a configuration of blocks serving as erase units in a flash memory provided in the memory card.

The flash memory 22 is, for example, made from a NAND type flash memory. As shown in FIG. 3, in the flash memory 22, a data transmitted from the host computer 1 is stored in each of the blocks serving as erase units. Each of the blocks 0, 1, 2, . . . , n consists of a data area for storing one page (512 bytes) of the data transmitted from the host computer 1 and a 16-byte redundant area. In the redundant area, there is stored management information for management of the data contained in the data area of the block. This management information, for example, includes: a block flag indicating a data write state; a linkage information indicating a linkage destination when a plurality of blocks constitute a single file; and a reverse flag indicating whether a data has been reversed when written in the data area. These management information items are read out by the host computer 1, to determine the state of the flash memory 22 when carrying out data read-out and write-in.

Here, the control IC 21, more specifically, includes a serial/parallel—parallel/serial interface sequencer (hereinafter, referred to as S/P & P/S sequencer) 31; a page buffer for temporarily storing data from the S/OP & P/S sequencer 31; a flash interface sequencer (hereinafter, referred to as a flash I/F sequencer) for supplying data from the page buffer 32 to the flash memory 22; an ECC encoder/decoder 34 for carrying out an error correction; a command generator 46 for generating a predetermined control command; a configuration ROM (read only memory) 36 which contains a version information and the like; and an oscillator 37 for supplying a clock to respective circuits.

The S/P & P/S sequencer 31 is connected, via the aforementioned first to third data lines, to the serial I/F 15 of the host computer 1. Consequently, the S/P & P/S sequencer 31 is supplied from the host computer 1 with a status signal, a serial clock SCLK, and a serial data DIO consisting of data and control data.

The S/P & P/S sequencer 31 converts the serial data DIO supplied from the host computer 1, into parallel data in synchronization with the aforementioned serial clock SCLK. Among these parallel data, the S/P & P/S sequencer 31, for example, supplies the command data to the command generator 35 and the data to the page buffer 32.

The page buffer 32 is a buffer memory for storing the data supplied from the S/P & P/S sequencer 31 on a page basis. The data stored in the page buffer 32 is added with an error correction sign by the ECC encoder/decoder 34. The pager buffer 32 supplies one-page of data along with the error correction sign, via the flash I/F sequencer 33, to flash memories 22a to 22d. Thus, the data from the host computer 1 is written in the flash memories 22a to 22d.

Moreover, data read out from the flash memories 22a to 22d is supplied via the flash I/F sequencer 33 to the page buffer 32.

The pager buffer 32 stores the data from the flash I/F sequencer 33. Here, the ECC encoder/decoder 34 executes an error correcting processing according to the error correction sign added to the data stored in the pager buffer 32. The pager buffer 32 reads out each page of data which has been subjected to the error correcting processing and supplies the data to the S/P & P/S sequencer 31. The S/P & P/S sequencer 31 converts the parallel data supplied from the page buffer 32, into a serial data DIO and transmits the obtained serial data DIO to the aforementioned host computer 1.

The command generator 35 generates a control command according to the control data from the S/P & P/S sequencer 31. For example, when the command generator 35 receives a read status register instruction for checking the operation state of the memory card 2, the command generator 35 determines a setting state of the erroneous erase preventing switch 23 and determines whether to write the data according to the setting state.

Moreover, the command generator 35 generates a busy command (hereinafter, referred to as a busy signal) indicating a state when data is being written into the flash memory 22 or data is being read out from the flash memory 22 and transmits the busy signal via the S/P & P/S sequencer 31 to the host computer 1. When the data write-in or read-out is complete, the command generator 35 generates a ready command (hereinafter, referred to as a ready signal) indicating the end of the data write-in or read-out and transmits the ready signal via the S/P & P/S sequencer 31 to the host computer 1. The host computer recognizes the operation state of the memory card 2 by receiving the busy signal and the ready signal.

The configuration ROM 36 contains information such as version information and an initial setting value of the memory card 2. Consequently, when a connection is made between the host computer 1 and the memory card 2, the command generator 35 first reads out via the S/P & P/S sequencer 31 the aforementioned version information from the configuration ROM 36 and according to this information, generates a predetermined command, so as to execute a predetermined initialization of the memory card 2.

Figure 4:
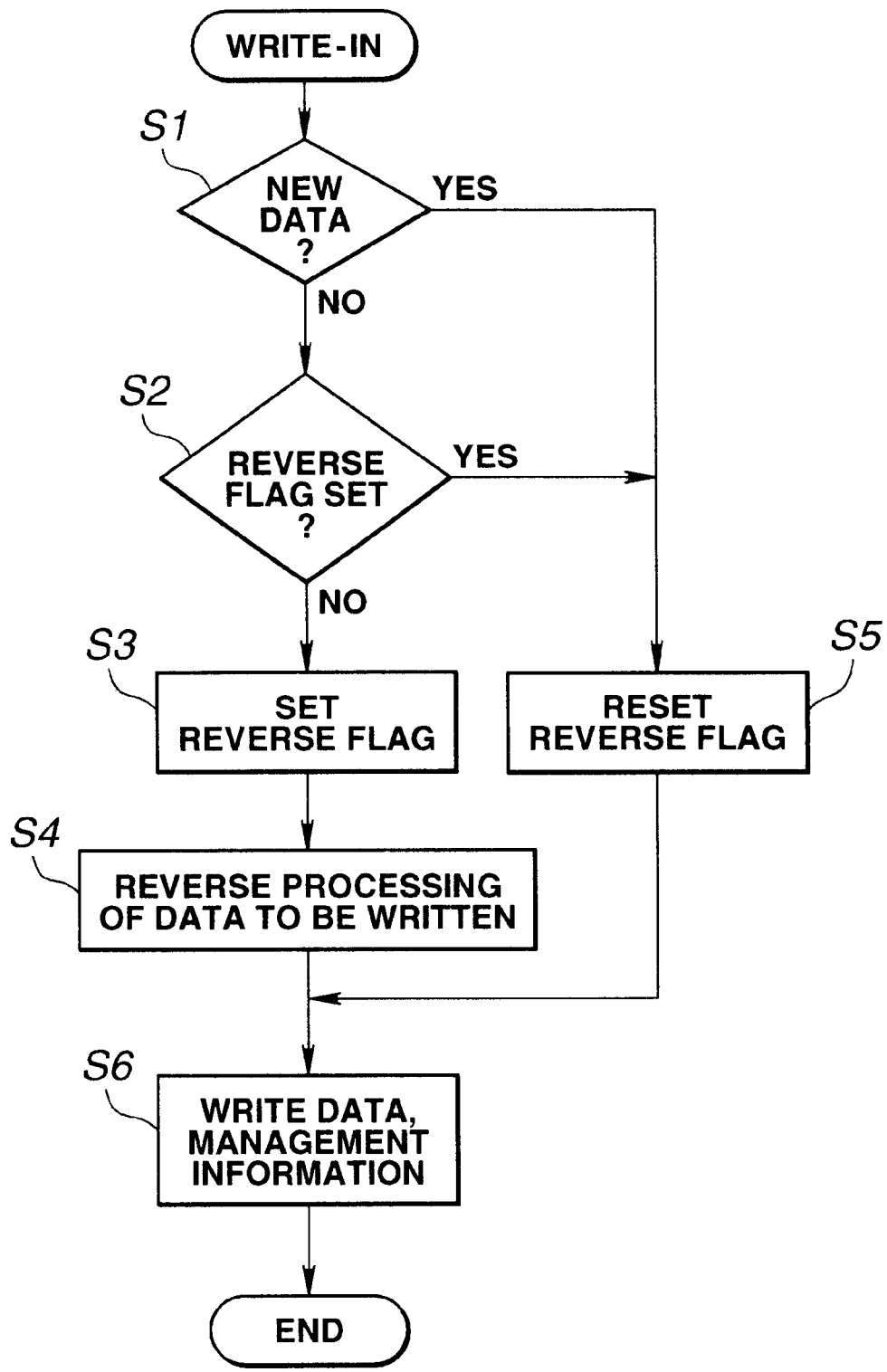
FIG. 4 is a flowchart explaining the operation executed when data is written in the memory card.

In the memory apparatus having the aforementioned configuration, the host computer 1 reads out in advance a management information of the flash memory 22 of the memory card 2 and stores this information in the RAM 12. When writing data into the memory card 2, the host computer 1 uses the aforementioned management information to execute the processing of steps S1 to S6 shown in FIG. 4.

In step S1, the CPU 17 of the host computer 1 determines whether data which has been read out from the hard disc 11, for example, so as to be transmitted to the memory card is new data. If the data is new, control is passed to step S5. If the data is not new, control is passed to step S2. That is, the CPU 17 determines whether the data is completely novel data or data similar to data transmitted to the memory card 2 and partially modified. If the data is determined to be new, control is passed to step S5 and if the data is similar to old data, control is passed to step S2.

In step S2, the CPU 17 determines whether a reverse flag is set in respective blocks to be used for data write-in. If the reverse flag is set, control is passed to step S5, and if not set, control is passed to step S3.

In step S3, the CPU 17 via the serial I/F 15 and the control IC 21 of the memory card 2, sets a reverse flag in the redundant area of the flash memory 22 and stores data to be transmitted, for example, in the RAM 12 from the hard disc 11, passing control to step S4.

On the other hand, when step 1 determines that the data is determined to be new and when step 2 determines that a reverse flag is set, in step S5 the CPU 17, via the control IC 21 of the memory card 2, resets the reverse flag in the redundant area of the flash memory 22 and stores data to be transmitted, for example, in the RAM 12 from the hard disc 11, passing control step S6.

In step S6, the CPU 17 transmits data stored in the RAM 12 and management information to be updated by this data, to the memory card 2 via the serial I/F 15, and writes this data in the flash memory, thus completing the processing.

As has been described above, when repeatedly writing similar data such as data partially modified, the host computer 1 executes bit reverse/non-reverse at each data write-in. This prevents concentration of cell damage to a particular cell in the flash memory caused by a data write-in and erase, averaging the cell damage, which in turn increases the service life of the flash memory 22.

Figure 5:
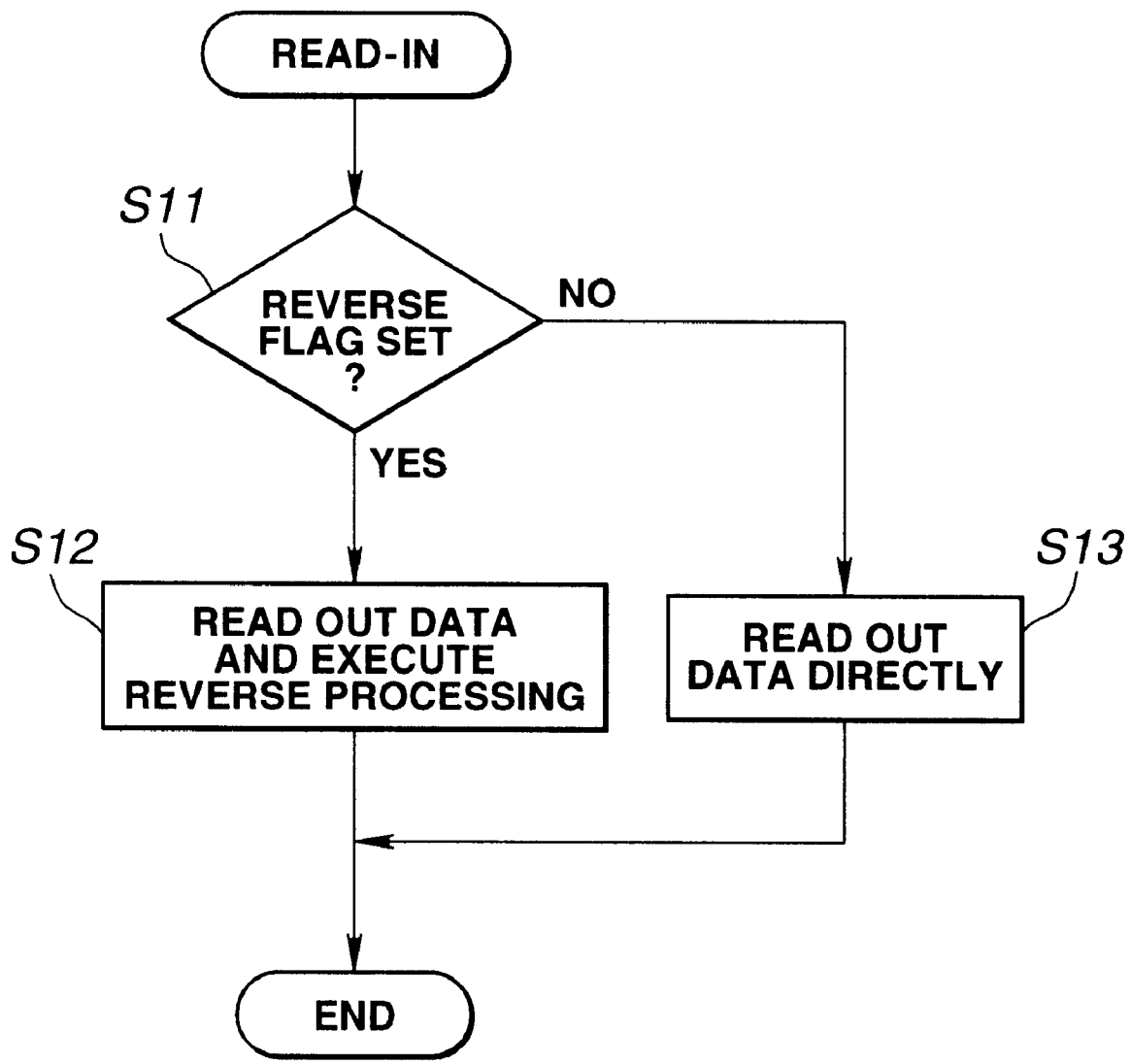
FIG. 5 is a flowchart explaining the operation executed when data is read out from the memory card.

Moreover, when the host computer 1 reads out data stored in the memory card 2, the host computer 1 uses management information stored in the RAM 12 so as to execute processing of steps S1 to S13 shown in FIG. 5.

In step S11, the CPU 17 of the host computer 1 determines whether a reverse flag stored in the RAM 12 is set. If the reverse flag is set, control is passed to step S12. If not, control is passed to step S13.

In step S12, the CPU 17, via the serial I/F 15 and control IC 21 of the memory card 2, reads out data from the flash memory 22, stores it in the RAM 12, and reverses the bits of this data, thus completing the read-out processing.

In step S13, the CPU 17, via the serial I/F 15 and the control IC 21 of the memory card 2, simply reads out data from the flash memory 22, thus completing the read-out processing.

As has been described above, when the reverse flag is set, the host computer 1 reads out data from the flash memory 22 and reverses the bits; and when no reverse flag is set, the host computer 1 directly reads out data from the flash memory 22. Thus, it is possible to read out a data written in the flash memory 22 through the bit reverse/non-reverse processing.

It should be noted that the present invention is not to be limited to the aforementioned embodiment but can be modified in design within the scope of the technical concept described in the Claims.

For example, as the host computer 1, it is possible to apply a still camera and a video camera. In such a case, the memory card 2 is controlled by the still camera or the like, so that image data is written in.

Moreover, as the host computer 1, it is possible to apply a reproduction apparatus capable of reading out audio data of music stored in the memory card 2 and outputting a sound. In this case, the data transfer rate between the host computer 1 and the memory card 2 is much faster than a data read-out speed from a magnetic tape and a CD (compact disc) and it is possible, for example, to carry out at a high speed a transfer of music.

What is claimed is:

1. A flash memory card comprising:

an erroneous erase preventing switch to prevent erroneous erasure of data stored in said flash memory card;

storage means for storing a plurality of bits of data divided into a plurality of blocks and a reverse flag for each of said blocks which is set when the bits of said data stored in the corresponding block are reversed, said storage means being comprised of flash memory circuits, each of said blocks comprising a page of data and a redundant data area, said reverse flag for each of said blocks being stored in the corresponding redundant data area; and control means for sending/receiving data from external sources and controlling data within said flash memory card, said control means comprising a page buffer for buffering said bits of data into blocks such that complete blocks are written into each block of said storage means; wherein when previously stored data is rewritten back into each block and the corresponding reverse flag is not set the bits are reversed and the corresponding reverse flag is toggled, and when previously stored data is rewritten back into each block and the corresponding reverse flag is set the bits are not reversed and the corresponding reverse flag is toggled.

2. A storage apparatus as claimed in claim 1, wherein when said control means writes new data into each block the bits are not reversed and the corresponding reverse flag is not set.

3. A data recording/reproducing method for a flash memory card comprising the steps of:

storing a plurality of bits of data divided into a plurality of blocks and a reverse flag for each of said blocks which is set when the bits of said data stored in the corresponding block are reversed, said data being stored in a storage means comprised of flash memory circuits, each of said blocks comprising a page of data and a redundant data area, said reverse flag for each of said blocks being stored in the corresponding redundant data area; and toggling the reverse flag for a block, and reversing the bits for that block when previously stored data is stored back into that block and the corresponding reverse flag is not set, and not reversing the bits for that block when previously stored data is stored back into that block and the corresponding reverse flag is set.

4. A data recording/reproducing method as claimed in claim 3, wherein when new data is written into each block the bits are not reversed and the corresponding reverse flag is not set.

5. A storage apparatus as claimed in claim 2, wherein said control means is further used for reading said bits of data out of each block of said storage means; wherein said control means reverses the bits of the read data when the corresponding reverse flag is set.

6. A data recording/reproducing method as claimed in claim 4, wherein said storing step further comprises reading said bits of data out of each block of said storage means; wherein the bits of the read data are reversed when the reverse flag for that block is set.

* * * * *